United States Patent [19]
Summers

[11] Patent Number: 5,393,864
[45] Date of Patent: Feb. 28, 1995

[54] WET-ETCHABLE RANDOM POLYIMIDE COPOLYMER FOR MULTICHIP MODULE APPLICATIONS

[75] Inventor: John D. Summers, Newton, Pa.

[73] Assignee: E. I. Du Pont de Nemours and Company, Wilmington, Del.

[21] Appl. No.: 51,828

[22] Filed: Apr. 26, 1993

[51] Int. Cl.[6] .................... C08G 73/10; C08G 69/26
[52] U.S. Cl. .................... 528/353; 528/125; 528/128; 528/170; 528/172; 528/173; 528/176; 528/183; 528/185; 528/188; 528/220; 528/229; 528/350; 528/351
[58] Field of Search ............... 528/353, 188, 125, 128, 528/170, 172, 173, 176, 183, 185, 220, 229, 350, 351

[56] References Cited

U.S. PATENT DOCUMENTS

| | | | |
|---|---|---|---|
| 4,623,563 | 11/1986 | Noda et al. | 428/901 |
| 4,778,872 | 10/1988 | Sasaki et al. | 528/176 |
| 5,138,028 | 8/1992 | Paul et al. | 528/353 |
| 5,162,492 | 11/1992 | Kaku | 528/353 |
| 5,166,292 | 11/1992 | Pottiger et al. | 528/353 |
| 5,166,308 | 11/1992 | Kreuz et al. | 528/353 |
| 5,196,500 | 3/1993 | Kreuz et al. | 528/353 |

*Primary Examiner*—John Kight, III
*Assistant Examiner*—P. Hampton-Hightower

[57] ABSTRACT

A random polyimide copolymer, based on a rigid dianhydride, a rigid diamine and an additional diamine and/or dianhydride containing one or more flexibilizing linkages. Soft-baked coatings of the poly(amic acid) precursor are readily processed using conventional aqueous base developers, such as tetramethylammonium hydroxide. The polyimide and soft-baked coatings are useful as a dielectric layer In multichip module applications or as a stress buffer coating.

3 Claims, No Drawings

WET-ETCHABLE RANDOM POLYIMIDE COPOLYMER FOR MULTICHIP MODULE APPLICATIONS

BACKGROUND OF THE INVENTION

The present invention relates to a random polyimide copolymer. More particularly, the invention relates to a random polyimide copolymer which is wet-etchable in its poly(amic acid) or partially cured poly(amic acid) precursor form.

Multichip module (MCM) packaging structures are being developed to achieve higher performance through component miniaturization. Multiple chips are mounted in close proximity and interconnected by a series of multilayer patterned conductor pathways insulated by a polymeric, preferably polyimide, dielectric. The structure is usually built on a suitable substrate such as a cofired multilayer ceramic. The package provides greater chip density and reduced interconnect length resulting in shortened signal propagation times and reduced power consumption. Design requirements on the interlayer dielectrics used in MCM fabrication are also becoming increasingly stringent as circuit density and the number of signal layers increases. Polyimide materials that combine low dielectric constant, water absorption and thermal expansion coefficient with high toughness, thermal stability, glass transition temperature, solvent resistance and adhesion are desirable for future generation MCM dielectrics.

Traditionally, circuit patterns have been defined in the fully cured polyimide dielectric layers by dry or plasma etching processes. While these techniques are useful for resolving fine geometries in thick films, the materials and processes involved are often expensive and/or time consuming. More recently, polyimide precursors that are inherently photosensitive have offered an alternative method for resolving feature sizes suitable for high density interconnect (HDI) applications. However, when overall cost becomes critical and the features to be resolved in the dielectric layers are consistent with those encountered in low and medium density interconnect (LDI and MDI respectively) applications, traditional wet etching processes may be desirable for patterning the MCM polyimide interlayer dielectric in its poly(amic acid) form.

U.S. Pat. No. 4,778,872, Sasaki et al, issued on Oct. 18, 1988, discloses an aromatic poly(amic acid) derived from 15 to 85 mole % of 3,3', 4,4'-biphenyltetracarboxylic dianhydride, 15 to 85 mole % of pyromellitic dianhydride, 30 to 100 mole % of p-phenylene diamine and 0 to 70 mole % of 4,4'-diaminodiphenylether. The aromatic poly(amic acid) can be formed into an aromatic polyimide film having a low thermal expansion coefficient, high mechanical strength and good flexibility. Sasaki et al do not disclose using flexible aromatic anhydrides and aromatic diamines as monomer components to impart wet-etchability to the poly(amic acid).

U.S. Pat. No. 4,623,563, Noda et al, issued on Nov. 18, 1986, discloses a polyimide/metallic foil composite film wherein the polyimide comprises at least 70 mole % of 3,3', 4,4'-biphenyltetracarboxylic dianhydride, 30 mole % or less of pyromellitic dianhydride, 80 mole % or more of p-phenylenediamine and 20 mole % or less of another diamine such as 4,4'-diaminodiphenylether or m-phenylenediamine. Noda et al require at least 80 mole % of the rigid p-phenylene diamine component and at least 70 mole % of the rigid 3,3', 4,4'-biphenyltetracarboxylic dianhydride in their copolyimides in order to match the CTE of the polyimide to that of the metallic foil, thereby minimizing curling of the composite film. Moreover, there is no disclosure of introducing additional flexible dianhydrides and/or diamines to impart wet-etchability to the poly(amic acid).

European Patent Application 0,470,446, published on Feb. 12, 1992, discloses polyimides having improved glass transition temperature for use in fiber filled composite articles comprising a mixture of 2,2-bis(3,4-dicarboxyphenyl)hexafluoropropane dianhydride and either 3,3', 4,4'-biphenyltetracarboxylic dianhydride or oxydiphthalic dianhydride and aromatic diamines such as m-phenylene diamine, p-phenylene diamine and 4,4'-diaminodiphenylether. There is no disclosure of using flexible dianhydrides and/or diamines as monomer components to impart wet-etchability to the poly(amic acid).

Accordingly, a need persists for a high performance polyimide for MCM fabrication having a good balance of mechanical, thermal and electrical properties and having the advantage of wet-etchability in its poly(amic acid) precursor form over a broad process range using conventional aqueous developers.

SUMMARY OF THE INVENTION

A random polyimide copolymer, which is wet-etchable in its poly(amic acid) or partially cured poly(amic acid) precursor form, consisting essentially of from 20 to 50 mole % of a rigid aromatic tetracarboxylic dianhydride component selected from the group consisting of pyromellitic dianhydride and 3,3', 4,4'-biphenyltetracarboxylic dianhydride, from 5 to 50 mole % of a rigid p-phenylene diamine component, and from 12 to 45 mole %, based on the total molar amounts of aromatic dianhydride and diamine components, of a flexible aromatic dianhydride and/or aromatic diamine component selected from the group consisting of m-phenylene diamine, 4,4'-diaminodiphenylether and 2,2-bis(3,4-dicarboxyphenyl)hexafluoropropane dianhydride, wherein said poly(amic acid) or partially cured poly(amic acid) has a wet-etch rate of from 0.3 to 1.0 micron/second ($\mu$m) in 0.26 N aqueous tetramethylammonium hydroxide solution, and wherein said polyimide copolymer has a glass transition temperature greater than 340° C. and a thermal expansion coefficient of from 15 to 30 ppm/° C.

DETAILED DESCRIPTION OF THE INVENTION

The present invention provides a random polyimide copolymer derived from a rigid aromatic dianhydride, such as pyromellitic dianhydride or 3,3', 4,4'-biphenyltetracarboxylic dianhydride; a rigid diamine, such as p-phenylene diamine; and containing an additional dianhydride and/or diamine containing one or more flexibilizing linkages, such as m-phenylene diamine, 4,4'-diaminobiphenylether or 2,2-bis(3,4-dicarboxyphenyl)-hexafluoropropane dianhydride.

The amount of the flexibilizing dianhydride and/or diamine monomer component ranges from 12 to 45 mole %, more preferably from 12 to 30 mole %, based on the total molar amounts of dianhydride and diamine components present in the composition.

Generally, the random poly(amic acid) copolymers or partially cured random poly(amic acid) copolymers of the invention include the poly(amic acid) copolymers corresponding to the random polyimide copolymers having recurring rigid structural units of the formula

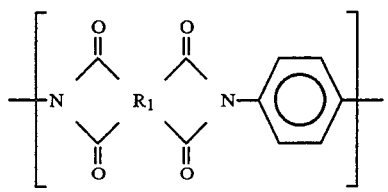

wherein $R_1$ is

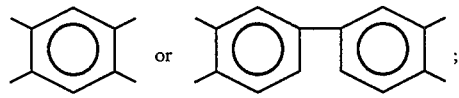

and additionally containing from 12 to 45 mole % of recurring flexible structural units of the formulas

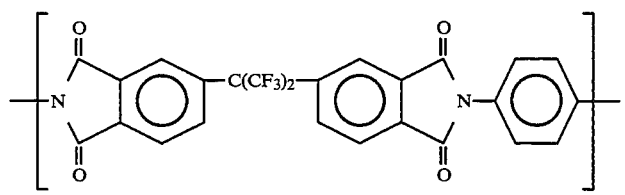

or

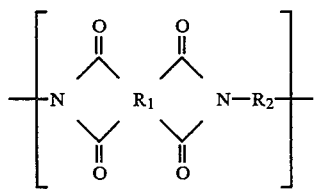

wherein $R_1$ is as defined above and $R_2$ is

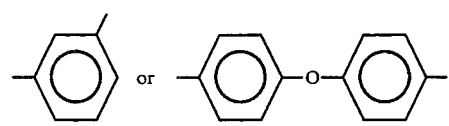

More specifically, the random poly(amic acid) copolymers or partially cured random poly(amic acid) copolymers of the invention include poly(amic acid) copolymers having recurring rigid structural units of the formula

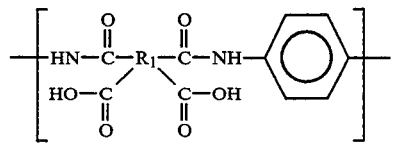

and, additionally, contain from 12 to 45 mole % of recurring flexible structural units of the formulas

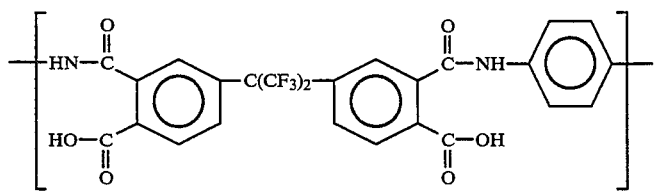

or

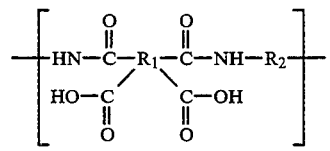

wherein $R_1$ and $R_2$ are as previously defined above.

A particularly preferred polyimide copolymer of the invention is derived from 30 mole % of 3,3', 4,4'-biphenyltetracarboxylic dianhydride, 20 mole % of 2,2-bis(3,4-dicarboxyphenyl)hexafluoropropane dianhydride and 50 mole % of p-phenylene diamine. This copolymer is wet-etchable in its poly(amic acid) precursor form, using traditional aqueous processes with metal ion or metal ion free developers. The completely cured polyimide has high modulus, tensile strength and elongation to break; a glass transition temperature of 385° C.; high thermal stability by thermogravimetric analysis; low dielectric constant; and decreased tendency to absorb water. The coefficient of thermal expansion (CTE) of the polyimide is about 19 ppm/° C. which matches the CTE's of copper and aluminum, common conductors in MCM constructions.

The wet-etch processing of polyimides requires a multistep procedure. Polyimide copolymers are generally made by dissolving the diamine(s) in a compatible organic solvent and then adding the dianhydride(s) which reacts with the diamine(s) to form a solution of the poly(amic acid) copolymer. The resulting solution of the poly(amic acid) copolymer is spin-coated on a substrate at a predetermined speed to achieve a desired thickness. The coated substrate is then heated in a soft-bake step to remove enough of the coating solvent and to obtain a tack free film. After soft baking, a positive photoresist material is applied in a similar manner, the spin speed and soft bake temperature being determined by the type of photoresist utilized. The photoresist material is then shielded with a mask containing a pattern of openings, and the photoresist material is exposed to actinic radiation, typically UV light. Thus, the photoresist material is photochemically altered such that the areas that were exposed to actinic radiation are soluble and vias (or openings) are created by taking advantage of this selected solubility to develop and remove specific areas of photoresist material. The poly(amic acid) copolymer coating can then be etched either along with the development and removal of the photoresist material, or through the vias created in the photoresist material. After the poly(amic acid) copolymer is etched, the unexposed photoresist material is removed and the remaining poly(amic acid) copolymer is imidized, generally by heating in a range of from about 200° C. to 400° C. to form the final coating. The vias (or openings) through the polymer coating permit access for electrical connections between the substrate and the outside environment or between subsequent layers.

Thus, wet-etching can be viewed as a process to dissolve selected areas of poly(amic acid) coating on a substrate with an appropriate solvent to form patterns or vias (openings) in the coating. In general, the etching process leaves areas of undissolved poly(amic acid) over some of the substrate while dissolving and removing poly(amic acid) over other areas of the substrate, to form a pattern of undissolved poly(amic acid) over the substrate.

In greater detail, the polyimide copolymers are typically made by dissolving one or more aromatic diamines in a polar aprotic solvent, such as N-methylpyrrolidinone or N,N-dimethylacetamide, and adding one or more aromatic dianhydrides which react with the diamine(s) to form a solution of the poly(amic acid) copolymer. The poly(amic acid) solution is diluted and spread on the substrate. The poly(amic acid) is then "soft-baked" (i.e. partially cured) by heating at a temperature of from 75° C. to 150° C. It is generally desirable to "soft-bake" the poly(amic acid) just enough to remove most of the coating solvent without causing significant imidization. A high temperature "soft bake" cure can promote imidization of the polymer, thus making the poly(amic acid) more difficult to wet etch. In some cases, the substrate can be coated with an adhesion promoter before applying the poly(amic acid) coating. Commercially available adhesion promoters include, for example, aminopropyltriethoxy silane which is available from Huls Chemical Company.

In general, the degree of dilution of the poly(amic acid) solution with polar aprotic solvent, such as N-methylpyrrolidinone, is based on the thickness requirement of the final coating, the viscosity, and solids content of the solution. Solutions of the poly(amic acid) copolymer generally range from about 5 to about 50 weight % of the total solution, preferably from about 10 to 40 weight % of the total solution. Above 50 weight %, the poly(amic acid) solution is generally too viscous to spread at a reasonable spin speed, and below 5 weight % the solution is not viscous enough to obtain the desired thickness at a reasonable spin speed.

The poly(amic acid) solution can be applied either statically or dynamically. In static application, the poly(amic acid) solution is dispensed to a nonrotating substrate and spread across the surface by spinning. In dynamic application, the poly(amic acid) solution is dispensed to a rotating substrate. In either case, the substrate is spun at a spin speed which depends on the final coating thickness required. The coating is typically thin, between about 1 and about 20 microns in thickness. The poly(amic acid) coated substrate is then coated with the positive photoresist material (for example, a commercially available, light sensitive polymer available from Shipley Company under the trade name S1813), and the coated substrate is heated at an elevated temperature of from about 75° C. to about 150° C. to remove the solvent from the photoresist material.

The photoresist material is then covered with a mask containing a pattern of vias (or openings) which are positioned where vias are desired in the poly(amic acid) coating. The photoresist material is thereafter exposed to actinic radiation to convert the photoresist material by photochemical reaction from an insoluble material to one that is soluble in basic aqueous developer solvents. Thus, the photoresist material can be selectively removed to form vias that uncover the poly(amic acid) coating.

Aqueous base solutions such as 0.26N NSD-TD (2.38% tetramethylammonium hydroxide) available from Tokyo Ohka Kogyo Co. Ltd. are used to develop the pattern in the photoresist after exposure. The developer solution forms water soluble salts with the exposed photoresist material and effectively allows the exposed photoresist material to be washed away. The unexposed photoresist material is not soluble in the aqueous base; therefore, the poly(amic acid) material that is underneath the unexposed photoresist is protected from the aqueous base by the layer of unexposed photoresist material.

Since the poly(amic acid) copolymer also contains acidic functionalities, the pattern generated in the photoresist will be transferred through the poly(amic acid) layer in the same development step. The poly(amic acid) copolymer is isotropically etched such that the polymer is dissolved in a radiating pattern that is essentially equidistant in all directions from the exposed surface. Therefore, the depth of the etch can be determined from the extent of removal of the poly(amic acid) as it undercuts the pattern-forming edge of the photoresist material. Isotropic etching yields patterned features having an average theoretical wall slope of about 45 degrees. However, the optimum resolution obtained by wet etching can be controlled by varying the soft-bake and development conditions, as well as the chemical composition of the developer, the poly(amic acid) copolymer and the photoresist material. The wet-etchable poly(amic acid) copolymers of the present Invention are particularly advantageous since they successfully resolve the desired pattern features under a variety of development conditions and, therefore, have broad processing latitude.

The poly(amic acid) etch rate is a major factor in determining wet etch process latitude. Poly(amic acid)s that do not etch upon exposure to aqueous base make pattern reproduction impossible by traditional wet etch processes. Poly(amic acid)s that etch very slowly subject the unexposed resist to excessively long exposures to the aggressive developer. Under these conditions, the resist is prone to "pitting" by the developer (i.e. the resist begins to lose its integrity). Accurate pattern reproduction then becomes a major concern. Long development times are also undesirable from a commercial standpoint, as production rates (device through-put) can be lowered significantly.

Poly(amic acid)s with excessive etch rates also limit process latitude. These materials tend to be very sensitive to process parameters such as development time and soft bake temperature. Therefore, the range of processing conditions yielding acceptable results can be extremely narrow and difficult to reproduce in a commercial process. The wet-etch rate of the poly(amic acid)s of the invention provide optimum results and range from 0.3 to 1.0 micron/second when measured in 0.26 N aqueous tetramethylammonium hydroxide solution.

After wet-etching of the photoresist material and the poly(amic acid), a water rinse can be used to remove any remaining developer and neutralized polymer. The unexposed photoresist is then stripped off using a solvent, such as butyl acetate, that dissolves the photoresist material but does not interact with the remaining poly(amic acid).

Finally, the poly(amic acid) copolymer is completely imidized to form the polyimide copolymer layer or coating. Imidization is typically accomplished at a temperature generally in the range of from about 130° C. to about 400° C. for from 60 to 300 minutes. The copolymer should be exposed to a temperature of 350°–400° for 60 minutes to ensure that complete imidization has occurred.

The poly(amic acid) and polyimide copolymers of the invention provide an excellent balance of properties and processing characteristics making them especially suitable for use in MCM applications. The fully cured polyimide copolymers have a dielectric constant less than 3.5, a water absorption of less than 2.5%, tensile modulus of 2.5 to 9 GPa, tensile strength of 130 to 400 MPa, elongation to break greater than 20%, thermal expansion coefficients of from, 3 to 40 ppm/° C., glass transition temperature greater than 340° C. and the solubility in solvents such as N-methylpyrrolidone. The poly(amic acid) copolymer precursors can be readily formulated to be self-priming and provide thick uniform coatings in a single spin coating operation and can be easily processed by conventional wet-etching techniques using conventional developers and procedures.

The following examples serve to illustrate certain embodiments of the herein disclosed invention. These examples should not, however, be construed as limiting the scope of the invention as there are many variations which may be made thereon without departing from the spirit of the disclosed invention, as those of skill in the art will recognize.

EXAMPLES

Glossary

PMDA = pyromellitic dianhydride
BPDA = 3,3', 4,4'-biphenyltetracarboxylic dianhydride
6FDA = 2,2-bis(3,4-dicarboxyphenyl)hexafluoropropane dianhydride
PPD = p-phenylene diamine
MPD = m-phenylene diamine
DDE = 4,4'-diaminodiphenylether
NMP = N-methylpyrrolidinone
TMAH = tetramethylammonium hydroxide
CTE = coefficient of thermal expansion (ppm/° C.)
TMA = thermomechanical analysis
Tg = glass transition temperature (° C.)
$\mu$m = micron
GPa = gigapascal
MPa = megapascal

Materials

Poly(amic acid) Preparation: Commercially available dianhydride and diamine monomers were used without further purification. Poly(amic acid) intermediates were prepared by conventional synthetic techniques that involved adding solid dianhydride to a stirred solution of diamine under anhydrous conditions and at ambient temperatures. Polymerizations were conducted in dry NMP.

Film Preparation: Films were prepared by spin-coating the virgin poly(amic acid) solutions onto silicon wafers. The coatings were soft-baked at 85° C. for 5 minutes on a hot plate, then cured at 135° C. for 30 minutes, 200° C. for 30 minutes and 350° C. for 60 minutes in a convection oven under a nitrogen atmosphere. Films were liberated from the substrates by acid dissolution of silicon dioxide, rinsed with water and then dried.

Analytical Methods

Thermal Properties: Thermogravimetric analysis was performed with a Du Pont 990 Thermal Analyzer using a 951 TGA module, programmed at 50° C. to 700° C. at a rate of 10° C./minute in a nitrogen carrier.

The in-plane CTE of the fully cured films were obtained using a Perkin-Elmer Thermomechanical Analyzer TMA-7 in extension mode with a force of 0.03 N. Film samples were placed in the TMA, preconditioned by heating to 250° C. in a dry helium environment, then cooled at 20° C./minute to −5° C. and equilibrated for 5 minutes. The samples were then ramped at 5° C./minute to 200° C. The in-plane CTE's were calculated from a linear fit of the expansion versus temperature data between 0° and 200° C.

The thin film mode of a Rheometrics RSA-II solids analyzer was used to obtain the dynamic mechanical spectra of cured films. Static pretension of a 100 gram film sample and a 0.1 percent dynamic strain amplitude were used for the measurements. The dynamic tensile modulus and tan delta were measured over a temperature range from 30° to 500° C. Tg's were determined from the peak in the tan delta curves.

Mechanical Properties: Mechanical properties were determined using an Instron Model 4501 Tensile Tester with a 1 kN load cell. Thin film samples of fully cured polyimide were prepared and analyzed according to ASTM D-882-83, Method A and ASTM D-2370-82.

Adhesion of fully imidized polymer coatings to silicon substrates was performed using ASTM D-3359-83 Method B standard boiling water tape pull test.

Moisture Absorption: A quartz crystal microbalance was employed to determine the moisture absorption of cured polyimide films. The frequency difference generated between a pair of matched quartz wafers (a reference wafer and a sample wafer coated with polymer) as a function of controlled humidity was accurately correlated with water uptake associated with the polymer coating.

Electrical Properties: Dielectric constants were determined according to the ASTM D 150 test method. The capacitance of a parallel plate capacitor made by sandwiching polymer film specimens between two metal electrodes was measured within the frequency range of 10 KHz to 10 MHz. The capacitance was related to the dielectric constant by the following equation:

$$Kr = C_{meas} - C_{edge}/C_{air}$$

Processing Conditions

Wafer Preparation: Silicon wafers were cleaned prior to use by washing them in Freon TMS solvent and then scrubbing them on a Silicon Valley Group Model 8620SSC wafer scrubber. The wafers were then baked at 300° C. for 30 minutes to remove any water.

Spin Coating: The poly(amic acid) solution was dispensed statically onto four inch silicon wafers using an SVG System 86 Coater. A two-stage spin coating operation was used to uniformly spread the solution over the wafers. The wafers were accelerated up to the desired spin speed using an acceleration rate of 20,000 rpm/sec.

Soft Bake: The coated wafers were then softbaked on an in-line hot plate or in a convection oven to yield tack free films. Shipley S1813 or Hoechst AZ-1350J positive photoresist was spin coated directly on the soft baked poly(amic acid) films using the SVG System 86 Coater and soft baked for one minute at 110° C. on an in-line hot plate or for 30 minutes in a forced air convection oven at 90° C.

Patterning: The resist was exposed using a Karl Suss Model MA56W instrument with 350 watt Hg broad band source (12 mW/cm$^2$ at I-line) in soft contact mode. A density gradient mask with 6, 8, 10, 12, 15, 19, 25, 31, 39, 50, 63, 80 and 92% transmission bands was employed and patterns were generated by a 120 mJ/cm$^2$ broad band dosage. Spray or dip processes were used to develop the exposed photoresist and the underlying soft baked polyimide. Spray development was performed with an SVG aqueous developer system. Two aqueous tetramethylammonium hydroxide developers (Tokyo Ohka NSD-TD and MF-312) and one alcohol assisted developer (DuPont DE-1000) were employed as the developers for the resist and the poly(amic acid), followed by a water rinse. Optical microscope inspection of the processed density gradient patterns established the feature spaces and corresponding exposure levels which were completely developed. The process latitude was defined by the number of adjacent exposure levels that were successfully resolved. The process was considered "broad" if five or more adjacent exposure levels were successfully developed. The resist was then stripped from the patterned soft baked poly(amic acid) with butyl acetate. Imidization was performed using the above heating profile to yield the patterned polyimide at typical thicknesses of 5 to 12 microns. Procedure templates are illustrated below for continuous and batch processes:

| | Continuous Process | Batch Process |
|---|---|---|
| 1. Poly(amic acid) coating (SVG System 86 Coater) | | |
| Dispense: | Static, 2 gm (approx.) | Static, 2 gm (approx.) |
| Spread: | 5 sec @ 500 rpm | 5 sec @ 500 rpm |
| Spin: | 30 sec @ 2200–5000 rpm | 30 sec @ 2200–5000 rpm |
| Softbake: | 3 min @ 120° C.–130° C. (hot plate) | 60 min @ 120° C.–130° C. (oven) |
| 2. Photoresist coating | Shipley S1813 | AZ-1350J |
| Dispense: | Static, 2 gm (approx.) | Static, 2 gm (approx.) |
| Spread: | 5 sec @ 500 rpm, 30 sec @ 2500 rpm | 60 sec @ 2000 rpm |
| Softbake: | 1 min @ 110° C. (in line hotplate) | 30 min @ 90° C. oven |
| Exposure: | 120 mJ/cm$^2$ (Karl Suss MA56) | 120 mJ/cm$^2$ (Karl Suss MA56) |
| 3. Development (0.26N TMAH, Tokyo Ohka) | | |
| Develop: (18 um coating) | Spray, 45 sec @ 1000 rpm | Dip, 80–100 sec |
| Rinse (water): | 10 sec @ 1000 rpm | Dip, 60 sec |
| Spin: | 20 sec @ 4000 rpm | air shower |
| Resist Strip: | Dip, Butyl Acetate (2 min) | Dip, Butyl Acetate (2 min) |

Etch Rate Evaluation

Spin Coating: The poly(amic acid) solution (2 grams) was dispensed onto a silicon wafer using an SVG System 86 Coater in a two-stage spin-coating operation. The wafer was spin-coated for 10 seconds at 500 rpm, followed by 60 seconds of 2200 rpm.

Soft-Bake: The coated wafer was then soft-baked for 3 minutes at 105° C., followed by 2 minutes at 125° C. The wafer was equilibrated for one minute at ambient temperature and the coating thickness was measured using an Alpha Step 200 thickness measuring instrument.

Developing: The wafer was developed at 5 second intervals by spraying with 0.26 N NSD-TD TMAH developer at 1000 rpm, followed by a 10 second water rinse at 1000 rpm, spin-drying for 20 seconds at 4000 rpm, rinsing with isopropanol to remove any residual water and, finally, spin-drying at 4000 rpm. The thickness of the coating on the developed wafer was measured to determine the amount of coating that was removed. The etch rate in microns/see was reported after 20 seconds of development exposure.

EXAMPLE 1

This example illustrates the preparation and wet-etching of a random BPDA(30)/6FDA(20)//PPD(50) polyimide copolymer using a continuous process.

NMP(300 ml.) was added to a dry, 3-neck, 2 liter round-bottom flask equipped with a nitrogen inlet and overhead stirrer. PPD (41.92 g, 0.388 mole) was added together with 100 ml of additional NMP. 6 FDA (67.86 g, 0.153 mole) and BPDA (67.41 g, 0.229 mole) were mixed together and slowly added to the stirred diamine solution along with an additional 300 ml of NMP. The poly(amic acid) reaction mixture was stirred for 24 hours at ambient temperature. The viscosity of the resulting poly(amic acid) solution was 90 to 110 poises.

The poly(amic acid) solution was spin coated onto silicon wafers, soft-baked at 120° C., patterned using Shipley S1813 photoresist coating, developed with TMAH spray and finally heat cured to form the final patterned polyimide, according to the continuous process previously described above. The physical, electrical and processing properties of the polyimide film are summarized in Table I.

TABLE 1

| PROPERTIES OF CURED BPDA(30)/6FDA(20)/PPD(50) POLYIMIDE FILM | | | |
|---|---|---|---|
| Property | PI-2611 | PI-2540 | Example 1 |
| Solids (%) | 12.5–14.5 | 13.5–15.5 | 19.0–21 |
| Viscosity (Poises) | 110–135 | 50–70 | 90–100 |
| Tensile Modulus (GPa) | 6.6 | 1.3 | 4.0 |
| Tensile Strength (MPa) | 600 | 160 | 250 |
| Break Elongation (%) | 60 | 60 | 53 |
| CTE (ppm/°C.) | 5.0 | 26 | 19 |
| TGA 5% loss (°C.) | 620 | 580 | 580 |
| Tg (°C.) | 350 | 400 | 385 |
| Dielectric Constant (1 MHz, 0% R.H.) | 2.9 | 3.2 | 2.8 |
| Water Absorbtion (%, 50% R.H.) | 0.8 | 3.0 | 0.9 |
| Self Priming | No | No | Yes |
| Wet Etch Process Latitude (TMAH) | Narrow | Broad | Broad |
| Etch Rate (μm/sec) | | | 0.60 |

The properties of two commercially available polyimides, PI-2611 (BPDA/PPD) and PI-2540 (PMDA/DDE) sold by E.I. dupont de Nemours and Co., are also included in Table I for purposes of comparison.

The rigid polyimide derived from BPDA and PPD (PI-2611) has good mechanical and thermal properties as evidenced by its high toughness, glass transition temperature and thermal stability. The low CTE of PI-2611 also minimizes stress to underlying substrates when used in MCM constructions. Electrical properties, such as low dielectric constant and water absorption are also satisfactory for MCM applications.

Although PI-2611 can be dry etched and photosensitive versions of PI-2611 provide satisfactory results, the rigid BPDA-PPD backbone does not readily lend itself to wet etch processing using conventional aqueous developers. Successful wet etching of thick films of PI-2611 is generally accomplished using specialized conditions and modified developers. Additionally, the rigid BPDA-PPD backbone yields high viscosity poly(amic acid) solutions, making one-step thick film deposition difficult using conventional spin coating techniques. Finally, PI-2611 generally requires the application of an adhesion promoter in a separate step prior to coating in order to obtain good adhesion to the substrate.

On the other hand, PI-2540 (due to the more flexible PMDA-DDE backbone) can be readily formulated at reasonable viscosity levels. The poly(amic acid) also has an extremely broad wet etch process latitude. However, PI-2540 has shortcomings that make it unattractive for MCM applications such as high water absorption, high dielectric constant, marginal mechanical properties and lack of self-priming characteristics.

The polyimide copolymer of the invention (Example 1) combines the favorable properties of PI-2611 with the convenience of PI-2540's wet etchability over a broad process range using conventional aqueous developers such as TMAH. The new polyimide copolymer can be formulated to yield thick coatings using a single spin coating application.

The polyimide copolymer of Example 1 has a high modulus combined with high tensile strength and elongation to break thereby imparting inherent toughness. Thermal properties are also attractive with a Tg of 385° C. and high thermal stability as deduced from TMA analysis. A glass transition temperature greater than 350° C. is an extremely important property for a polymeric dielectric material in order to eliminate pattern distortion during high temperature metallization procedures. In addition to good mechanical and thermal properties, the copolymer also has a low dielectric constant and low water absorption. The CTE of the copolymer also matches the CTE's of copper and aluminum, common conductors used in MCM constructions.

EXAMPLES 2 TO 4

These examples illustrate the preparation of random BPDA/6FDA//PPD polyimide copolymers containing different amounts of 6 FDA.

The copolymers were prepared as described for Example 1 using the molar amounts of 6 FDA given in Table II. Physical and electrical properties of the copolymers are given in Table II.

TABLE II

| | | PROPERTIES OF CURED BPDA/6FDA/PPD POLYIMIDE FILMS | | | | | | |
|---|---|---|---|---|---|---|---|---|
| Example | Mole % 6FDA | Tensile Modulus (GPa) | Tensile Strength (MPa) | Elongation (%) | CTE (ppm/°C.) | Dielect. Constant | Water Absorp. (%) | Wet-Etch Rate (μm/sec) (TMAH) |
| — | 0.0 | 6.7 | 420 | 35 | 3.5 | 3.02 | 1.4 | 0 |
| — | 5.0 | 6.3 | 400 | 49 | 6.1 | 3.00 | | 0 |
| — | 10.0 | 5.3 | 361 | 53 | 10.9 | 2.95 | 1.6 | 0 |
| 2 | 12.5 | 4.4 | 329 | 56 | 15.8 | 2.90 | | 0.5 |
| 3 | 15.0 | 4.4 | 329 | 56 | 20.2 | 2.88 | 1.9 | 0.5 |
| 4 | 25.0 | 3.7 | 211 | 47 | 28 | 2.87 | 2.3 | 0.8 |

Examples 2, 3 and 4 exhibit an excellent balance of mechanical and electrical properties required for MCM fabrication including high modulus, high toughness, low dielectric constant and low water absorption. Increasing the FDA content in the copolymer decreased the tensile modulus and tensile strength slightly, reflecting the added backbone flexibility afforded by the hexafluorisopropylidene linkage. Elongation remained high throughout the entire 6 FDA composition range. Mechanically all of the copolymers exhibited excellent toughness and were suitable for MCM requirements. The CTE's Increased with Increasing 6 FDA content, again illustrating the Increased chain flexibility imparted by the 6 FDA monomer. Copolymers with tailored CTE's were obtained by simply controlling the 6 FDA content in the copolymer. Advantageously, the dielectric constant decreased with increasing 6 FDA content. Copolymers with 6 FDA contents above 12 mole % were also wet etchable using conventional aqueous TMAH developers.

EXAMPLE 5

This example illustrates the wet etch process latitude and resolution capabilities of the polyimide copolymer of Example 1 prepared by a batch process as a function of coating thickness, soft-bake temperature, type of TMAH developer used and development time. The results are summarized in Table III.

hours at ambient temperature. The viscosity of the resulting poly(amic acid) solution was 130 poises.

The poly(amic acid) solution was spin-coated onto silicon wafers, soft-baked at 120° C., patterned using Hoechst AZ-1350J photoresist coating, developed with TMAH spray and heat cured to form the final patterned polyimide, according to the batch process previously described above. The physical, electrical and process-

TABLE III

WET-ETCH PROCESSABILITY OF RANDOM BPDA(30)/
6FDA(20)/PPD(50) POLY(AMIC ACID) COPOLYMER

| THICKNESS (μm) | SOFT BAKE (°C./min) | TMAH DEVELOPER* (0.26N) | DEVELOP TIME (sec) | LATITUDE (%) | RESOLUTION (μm) |
|---|---|---|---|---|---|
| 8 | 130/60 | Tokyo Ohka | 40 | 39–92 | 15 |
| 8 | 130/60 | DE-1000 | 40 | 31–32 | 15 |
| 8 | 130/60 | MF-312 | 43 | 39–92 | 15 |
| 11 | 130/60 | Tokyo Ohka | 60 | 39–92 | 20 |
| 11 | 130/60 | DE-1000 | 60 | 25–92 | 20 |
| 18 | 130/60 | MF-312 | >120 | | |
| 11 | 125/60 | DE-1000 | 50 | 19–25 | 20 |
| 11 | 125/60 | MF-312 | 50 | 39–92 | 20 |
| 18 | 125/60 | Tokyo Ohka | 100 | 39–92 | 25–30 |
| 18 | 125/60 | DE-1000 | 90 | 25–92 | 25 |
| 18 | 125/60 | MF-312 | >180 | | |
| 11 | 120/60 | Tokyo Ohka | 40 | 39–50 | 20 |
| 11 | 120/60 | DE-1000 | 40 | 19–31 | 20 |
| 18 | 120/60 | Tokyo Ohka | 80 | 39–92 | 25 |
| 18 | 120/60 | DE-1000 | 80 | 25–92 | 25 |
| 18 | 120/60 | MF-312 | >180 | | |

*Tokyo Ohka 0.26N aqueous TMAH with added surfactant
DE-1000 0.26N aqueous TMAH (alcohol assisted)
MF-312 0.26N aqueous TMAH with no surfactant Optimum conditions for processing thick 18 micron poly(amic acid) copolymer coatings for MCM applications were obtained using 120° to 125° C. soft-bake temperatures and DE-1000 0.26N TMAH alcohol assisted developer. Broad process latitude (25 to 92% exposure levels) was obtained under these conditions and 25 micron lines were successfully resolved with wall slopes of approximately 65 degrees. The same resolution was obtained using the Tokyo Ohka 0.26 N aqueous TMAH developer with added surfactant. However, the process latitude was somewhat inferior to that obtained with DE-1000 developer, since features in the lower exposure regions of the density gradient mask were not as efficiently resolved. The MF-312 0.26 N aqueous TMAH developer without added surfactant was not suitable for resolving the poly(amic acid) at this thickness.

All three developers were successfully used to pattern thin 8 micron poly(amic acid) coatings at soft-bake temperatures of 130° C. Development times of approximately 40 seconds were used to achieve 15 micron resolution and broad process latitudes. Again, development conditions yielded patterns with wall slopes of approximately 65 degrees in the soft-baked coating, ultimately translating to 55 degree slopes in the fully imidized coating.

EXAMPLE 6

This example illustrates the preparation of a wet etching random BPDA(50)/PPD(25)/MPD(25) polyimide copolymer.

NMP (100 ml) was added to a dry, 3-neck, 2 liter round-bottom flask equipped with a nitrogen inlet and overhead stirrer. PPD (6.9858 g, 0.0646 moles) and MPD (6.9858 g, 0.0646 moles) were added to the flask with an additional 100 ml NMP. BPDA (37.4517 g, 0.1273 moles) was then slowly added to the stirred diamine solution and rinsed in with 40 ml NMP. The poly(amic acid) reaction mixture was stirred for 24 ing properties of the polyimide film are summarized in Tables IV and V.

TABLE IV

| PROPERTIES OF CURED BPDA/PPD/MPD POLYIMIDE COPOLYMER FILMS | | | | |
|---|---|---|---|---|
| Example | — | — | 6 | 7 |
| Mole % MPD | 5 | 10 | 25 | 45 |
| Ten. Mod. GPa | 6.3 | 5.7 | 4.3 | 3.1 |
| Ten. Str. MPa | 420 | 412 | 252 | 140 |
| Elong. % | 63 | 58 | 67 | 55 |
| CTE ppm/°C. | 5.5 | 9.5 | 21 | 35 |
| Dielec. Const. | 3 | 3 | 3.1 | 3.1 |
| Water Uptake % | 1.5 | 1.6 | 2.2 | 3.5 |
| Etch Rate μm/sec | 0 | 0 | 0.4 | 0.7 |
| Tg °C. | | | 345 | |

TABLE V

| WET ETCH PROCESSABILITY OF RANDOM BPDA(50)/PPD(25)/MPD(25) COPOLYMER FILMS | | |
|---|---|---|
| Example | 6 | 6 |
| Thickness, μm | 18 | 8 |
| Soft Bake, °C./min | 120/60 | 130/60 |
| TMAH Developer | Tokyo Ohka | Tokyo Ohka |
| Develop Time, sec | 90 | 45 |
| Latitude, % | 39–92 | 39–92 |
| Resolution, μm | 30 | 20 |

EXAMPLE 7

This example illustrates the preparation of a wet-etching random BPDA(50)/PPD(5)/MPD(45) polyimide copolymer.

The copolymer was prepared as described for Example 6, except that the molar amount of MPD used was 45 mole % instead of 25 mole %. The physical, electrical and processing properties of the cured polyimide film are given in Table IV.

EXAMPLE 8

This example illustrates the preparation of a wet etching random BPDA(50)/PPD(25)/DDE(25) polyimide copolymer.

NMP (100 ml) was added to a dry, 3-neck, 2 liter round-bottom flask equipped with a nitrogen inlet and overhead stirrer. PPD (6.9858 g, 0.0646 moles) and DDE (12.9355 g, 0.0646 moles) were added to the flask with an additional 100 ml NMP. BPDA (37.4517 g, 0.1273 moles) was then slowly added to the stirred diamine solution and rinsed in with 50 ml NMP. The poly(amic acid) reaction mixture was stirred for 24 hours at ambient temperature. The viscosity of the resulting poly(amic acid) solution was 140 poises.

The poly(amic acid) solution was spin-coated onto silicon wafers, soft-baked at 120° C., patterned using Hoechst AZ-1350J photoresist coating, developed with TMAH spray and heat cured to form the final patterned polyimide, according to the batch process previously described above. The physical, electrical and processing properties of the polyimide film are summarized in Tables VI and VII.

TABLE VI

PROPERTIES OF CURED BPDA(50)/PPD(25)/DDE(25) POLYIMIDE COPOLYMER FILMS

|  | Example 8 |
| --- | --- |
| Mole %, DDE | 25 |
| Tensile Modulus, GPa | 3.4 |
| Tensile Strength, MPa | 215 |
| Elongation, % | 52 |
| CTE, ppm/°C. | 26 |
| Dielectric Constant | 3.1 |
| Water Uptake, % | 2.1 |
| Etch Rate, μm/sec | 0.4 |
| Tg, °C. | 350 |

TABLE VII

WET ETCH PROCESSABILITY OF RANDOM BPDA(50)/PPD(25)/DDE(25) COPOLYMERS

| Example | 8 | 8 |
| --- | --- | --- |
| Thickness, μm | 18 | 8 |
| Soft Bake, °C./min | 120/60 | 130/60 |
| TMAH Developer | Tokyo Ohka | Tokyo Ohka |
| Develop Time, sec | 80 | 45 |
| Latitude, % | 39–92 | 39–92 |
| Resolution, μm | 30 | 20 |

What is claimed is:

1. A random poly(amic acid) copolymer or partially cured poly(amic acid) copolymer consisting essentially of from 20 to 50 mole % of a rigid aromatic 3,3', 4,4'-biphenyltetracarboxylic dianhydride component, from 5 to 50 mole % of a rigid p-phenylene diamine component, and from 12 to 45 mole %, based on the total molar amounts or aromatic dianhydride and diamine components, of a flexible aromatic 2,2-bis(3,4-dicarboxyphenyl)hexafluoropropane dianhydride component, wherein said poly(amic acid) or partially cured poly(amic acid) has a wet-etch rate of from 0.3 to 1.0 micron per second in 0.26 N aqueous tetramethylammonium hydroxide solution.

2. The random poly(amic acid) copolymer or partially cured poly(amic acid) copolymer of claim 1, consisting essentially of from 20 to 38 mole % of 3,3', 4,4'-biphenyltetracarboxylic dianhydride, 50 mole % of p-phenylene diamine and from 12 to 30 mole % of 2,2-bis(3,4-dicarboxyphenyl)hexafluoropropane dianhydride.

3. The random poly(amic acid) copolymer or partially cured poly(amic acid) copolymer of claim 2, consisting essentially of 30 mole % of 3,3', 4,4'-biphenyltetracarboxylic dianhydride, 50 mole % of p-phenylenediamine and 20 mole % of 2,2-bis(3,4-dicarboxyphenyl)hexafluoropropane dianhydride.

* * * * *